: (12) United States Patent
Radermacher

(10) Patent No.: US 9,320,120 B2
(45) Date of Patent: Apr. 19, 2016

(54) DATA GENERATING SYSTEM AND LIGHTING DEVICE

(71) Applicant: KONINKLIJKE PHILIPS N.V., Eindhoven (NL)

(72) Inventor: Harald Josef Günther Radermacher, Aachen (DE)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 0 days.

(21) Appl. No.: 14/391,726

(22) PCT Filed: Apr. 11, 2013

(86) PCT No.: PCT/IB2013/052875
§ 371 (c)(1),
(2) Date: Oct. 10, 2014

(87) PCT Pub. No.: WO2013/153527
PCT Pub. Date: Oct. 17, 2013

(65) Prior Publication Data
US 2015/0069919 A1    Mar. 12, 2015

Related U.S. Application Data

(60) Provisional application No. 61/623,605, filed on Apr. 13, 2012.

(51) Int. Cl.
*H05B 37/02* (2006.01)
*G11C 7/04* (2006.01)
*H05B 33/08* (2006.01)

(52) U.S. Cl.
CPC ............. *H05B 37/0272* (2013.01); *G11C 7/04* (2013.01); *H05B 33/0872* (2013.01); *H05B 37/029* (2013.01); *H05B 37/0218* (2013.01); *H05B 37/0227* (2013.01)

(58) Field of Classification Search
CPC .. H05B 37/02; H05B 33/0872; H05B 37/029; H05B 37/0227
USPC .......................................... 315/152, 307–309
See application file for complete search history.

(56) References Cited

U.S. PATENT DOCUMENTS

| | | | |
|---|---|---|---|
| 4,441,125 A * | 4/1984 | Parkinson ...................... | 348/302 |
| 2007/0028061 A1 | 2/2007 | Takehana et al. | |
| 2009/0309258 A1* | 12/2009 | Lendlein ....................... | 264/230 |
| 2010/0097838 A1* | 4/2010 | Tanaka et al. ................. | 365/112 |
| 2010/0199020 A1 | 8/2010 | Lin et al. | |
| 2011/0069960 A1 | 3/2011 | Knapp et al. | |
| 2013/0303981 A1* | 11/2013 | Kizhakkedathu et al. . | 604/95.05 |

FOREIGN PATENT DOCUMENTS

| | | |
|---|---|---|
| EP | 1858021 A2 | 11/2007 |
| JP | 4369095 A | 12/1992 |

* cited by examiner

*Primary Examiner* — Don Le
(74) *Attorney, Agent, or Firm* — Meenakshy Chakravorty

(57) ABSTRACT

The present invention relates to a data generating system comprising a memory device (302), which comprises memory cells (306, 308) and a cell content access unit (310) arranged to access content in the memory cells and provide corresponding output data, wherein the output data originating from at least one of the memory cells (306) is changeable by means of an external physical effect acting directly on the memory device.

9 Claims, 5 Drawing Sheets

DATA GENERATING SYSTEM AND LIGHTING DEVICE

CROSS-REFERENCE TO PRIOR APPLICATIONS

This application is the U.S. National Phase application under 35 U.S.C. §371 of International Application No. PCT/IB2013/052875, filed on Apr. 11, 2013, which claims the benefit of U.S. Provisional Patent Application No. 61/623,605, filed on Apr. 13, 2012. These applications are hereby incorporated by reference herein.

FIELD OF THE INVENTION

The present invention relates to a data generating system comprising a memory device, which comprises memory cells and a cell content access unit arranged to access content in the memory cells and provide a corresponding output data, and to a lighting device comprising such a data generating system.

BACKGROUND OF THE INVENTION

Solid State Light (SSL), e.g. Light Emitting Diode (LED), light sources offer significant benefits compared to traditional light sources, e.g. better efficiency, no mercury, instant start, etc. In addition to this, the fast response of these light sources allow to embed some data into the emitted light, such that information is send out and can be retrieved by suitable receivers.

The data to be sent out by the light source has to be stored somewhere, to allow stand-alone operation of the light source. Data may consist of static data, e.g. light source type identifier; one time programmable data, e.g. serial number, and date of installation; and data that changes during operation, e.g. operation hours, and temperature.

In especially for the data that might change during operation, a high effort is required to capture the data, embed it into the data stream and store it into some data storage, which should be non-volatile.

In a normal situation, a lighting device 100 is provided with a relatively competent data generating system, as depicted in FIG. 1, for acquiring data, storing data, and generating data to the lighting device. More particularly, data is transmitted from the data generating system to a light communication part of the lighting device. In particular, the light communication part includes a modulator 110, which is connected with a LED driver 112 and modulates the light output of the lighting device, thereby embedding the data in the light output. The data generating system 100 comprises a non-volatile alterable storage 102, e.g. an EEPROM, a micro processor (μC) 104, sensors 106 sensing external physical effects, and a clock generator 108. Although these are only a few components, in particular the μC will add significant cost to the data generating system. Even problems might result from using a μC, because these devices typically operate at quite high clock speeds in the MHz range, creating EMI emissions.

Looking at the task to be performed by the data generating system, a basic sketch is given in FIG. 2. There are multiple tasks that may be executed in a parallel or serial fashion.

On one hand, measurements have to be taken and translated into digital data. An example might be the actual temperature. In addition, this data might have to be compared to the already stored data, in order to track f.i. the maximum temperature the lighting device has been exposed to, during the total life time. In case the current temperature is higher, the value stored so far has to be replaced by the new value. Operating hours might be tracked, so after the elapse of some time (depending on the granularity), but latest at power down of the lamp, the additional operation hours have to be stored in the memory.

In parallel to this capturing and manipulation of data, a data package has to be prepared for transmission. In the simplest case, the data is stored in the order of the transmission and sent to some modulator. Alternatively, the complete data stream is prepared in a volatile memory, based on input from the non-volatile memory and actual sensing data, and then sent to the modulator.

The prior art data generating system is a complex solution.

SUMMARY OF THE INVENTION

It is an object of the present invention to provide a data generating system that alleviates the above-mentioned problems of the prior art, and which provides a less complex solution capable of solving the same tasks.

The object is achieved by a data generating system according to the present invention as defined in claim 1, and by a lighting device according to the present invention as defined in claim 7.

The invention is based on the insight that data logging is not required with the "digital" precision possible with such a prior art data generating system. For instance, for the operating hours, typically it is not really a differentiator if the device hosting the data generating system has been operated for 14763 hours, or for 15000 hours +−5%.

Thus, in accordance with an aspect of the present invention, there is provided a data generating system comprising a memory device, which comprises memory cells and a cell content access unit arranged to access content in the memory cells and provide corresponding output data, wherein the output data originating from at least one of the memory cells is changeable by means of an external physical effect acting directly on the memory device.

Thereby, a data generating system with embedded manipulation of data has been obtained. The memory device of this data generation system will significantly simplify the data generation system, since there is no longer a need for a micro computer as the sensor function is provided by the very memory device, and the result of the sensed external physical effect is given by the output data.

In accordance with an embodiment of the data generation system, the output data is changeable by said at least one of the memory cells being receptive to the external physical effect for changing the contents of said at least one memory cell. By having the physical effect affecting the very content of the memory cell/cells, many interesting applications are possible.

In accordance with an embodiment of the data generation system, the output data is changeable by said content access unit being receptive to the external physical effect for changing its interpretation of the content of said at least one of the memory cells. In this embodiment, on the other hand, the very content is kept substantially fixed. The technology for keeping the memory content substantially unchanged over a long time is highly developed, which is advantageous to employ in many applications. Instead, the change due to the physical effect is provided in the unit interpreting the content, i.e. the content access unit.

In accordance with an embodiment of the data generation system, said at least one of the memory cells comprise at least one memory cell (500a) which is provided with a temperature sensitive leakage. This kind of sensitivity is useful for temperature detection.

In accordance with another aspect of the present invention, there is provided a lighting device comprising a light source and a data generating system according to any one of the preceding claims. The data generating system is advantageously used in a lighting device, since the relative reduction of the cost of manufacture is noticeable and important, and it reduces the complexity of lighting systems comprising several lighting devices as well.

In accordance with an embodiment of the lighting device, the data generating system is arranged to register a lighting device property that changes during operation of the lighting device. Thereby, the data generating system is employed for automatically detecting internal changes that might have an impact on the performance of the lighting device.

In accordance with an embodiment of the lighting device, it is arranged to modulate its light output with the output data from the data generating system. Thereby, the output data is transmitted remotely of the lighting device, such as to a controller of a lighting system including several lighting devices.

These and other aspects and advantages of the invention will be apparent from and elucidated with reference to the embodiments described hereinafter.

BRIEF DESCRIPTION OF THE DRAWINGS

The invention will now be described in more detail and with reference to the appended drawings in which.

DESCRIPTION OF PREFERRED EMBODIMENTS

The data generating system according to the present invention is designed such that certain bits in the data stream which is output from the memory device included in the data generating system will alter their value automatically during operation.

Figure 3:
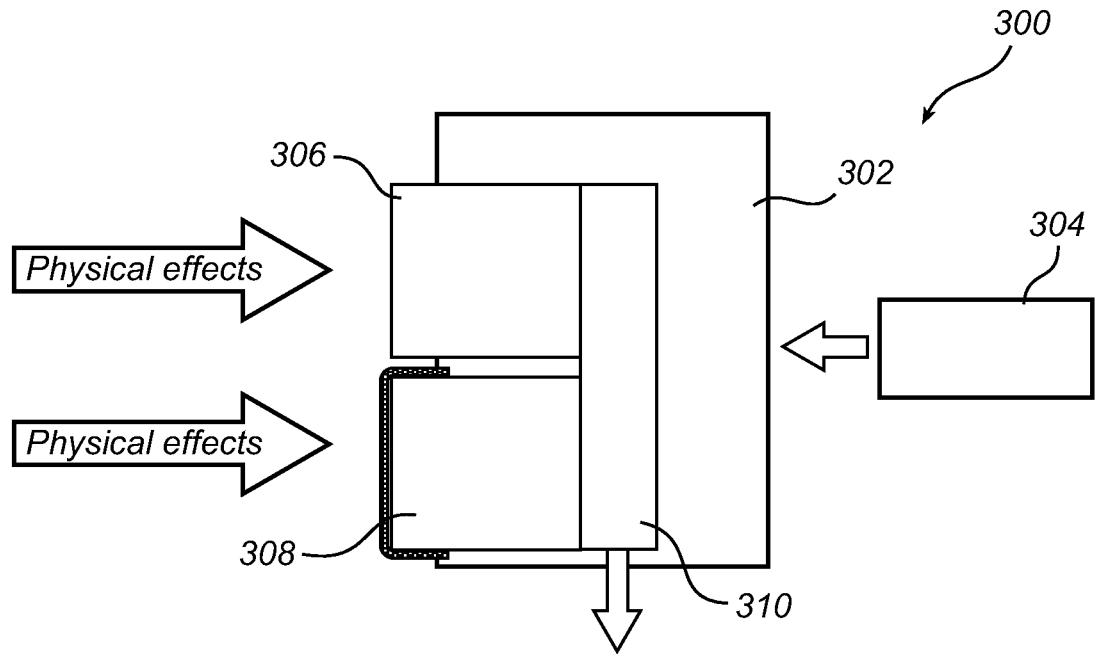
FIG. 3 schematically shows a representation of an embodiment of a data generation system according to the present invention.

According to a first embodiment of the data generating system 300, as shown in FIG. 3, it comprises a memory device 302 having a non-volatile memory, and a data output trigger 304, which for instance comprises a clock generator and a counter or the like. The data output trigger 304 triggers data output from the memory device 302. The memory device 302 comprises several memory cells, and the output data originating from a first set of memory cells 306, consisting of at least one memory cell, is changeable by means of an external physical effect acting directly on the memory device 302, and in this embodiment, directly on the first set of memory cells 306. Thus, the content, i.e. data, of the first set of memory cells 306 is sensitive to the external physical effect, which changes the content when the physical effect affects the first set of memory cells 306. In absence of the external physical effect, the content of the first set of memory cells 306 remains unchanged. As understood by a person skilled in the art, the expression "remains unchanged" is to be considered in relation to what happens when the physical effect is applied. Of course over time, longer or shorter depending on the kind of memory, the content may change anyhow but the kind of memory should be chosen such that this long term rate of change is considerably lower than the change when subject to the physical effect. The first set of memory cells 306 is suitable for storing typical time varying data such as operation hours, calendar age, surrounding temperature, etc.

Further, the memory device 302 comprises a second set of memory cells 308, the content of which is insensitive to external physical effects, or at least not tuned towards certain susceptibility for a particular effect. Thus, the second set of memory cells 308 is suitable for storing static data, such as identification data, date of manufacture, etc.

Furthermore, the memory device 302 comprises a cell content access unit 310, which is connected with the memory cells 306, 308, and which is arranged to read out the content, i.e. the data, of the memory cells 306, 308 and transmit it to a content handling device of any suitable kind, depending on how the content is to be used, i.e. what kind of system the data generating system 300 is integrated with. The cell content access unit 310 can be a combined amplifier and comparator, a simple ADC (Analog-to-Digital-Converter), or the like.

The changeable output data can be achieved in different ways, such as:
a) "Weak" programming of bit levels and temperature dependency of the cell content access unit
b) Temperature dependency of leakage current
c) Light sensitivity of memory cells or cell content access unit
d) Capacitive/inductive coupling between input/load voltages and currents and memory cells.

Figure 1:
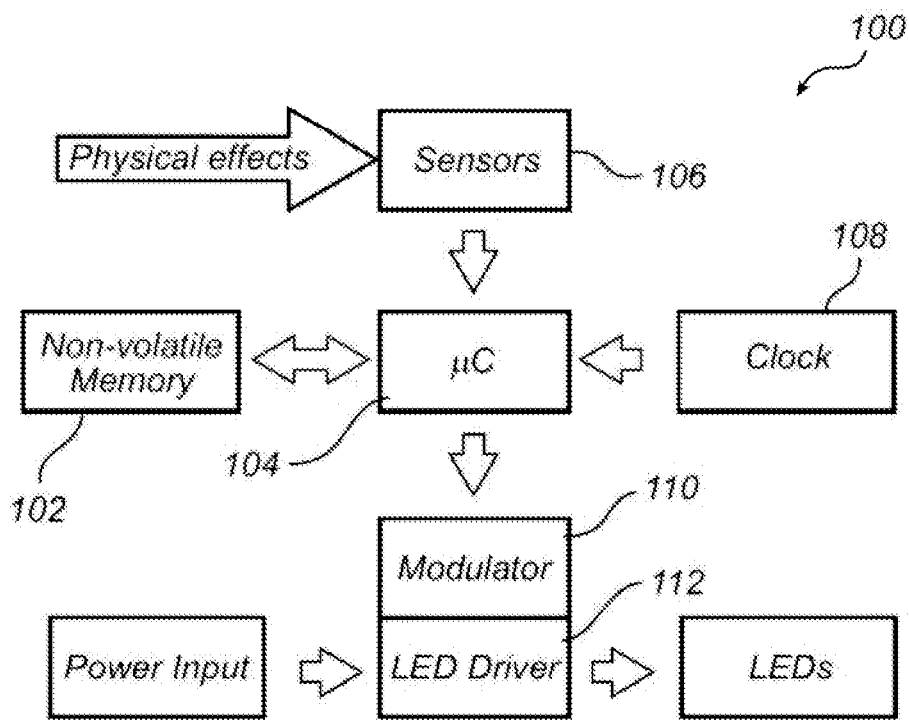
FIG. 1 is a block diagram of a prior art lighting device.
Figure 2:
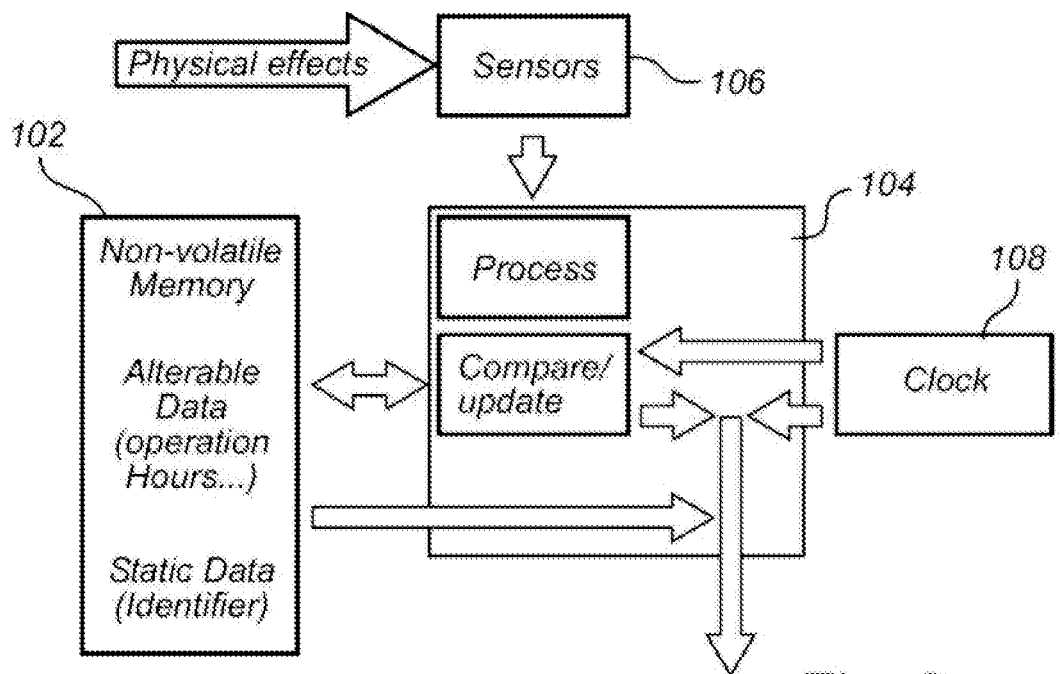
FIG. 2 illustrates the operation of the prior art lighting device.
Figure 4:
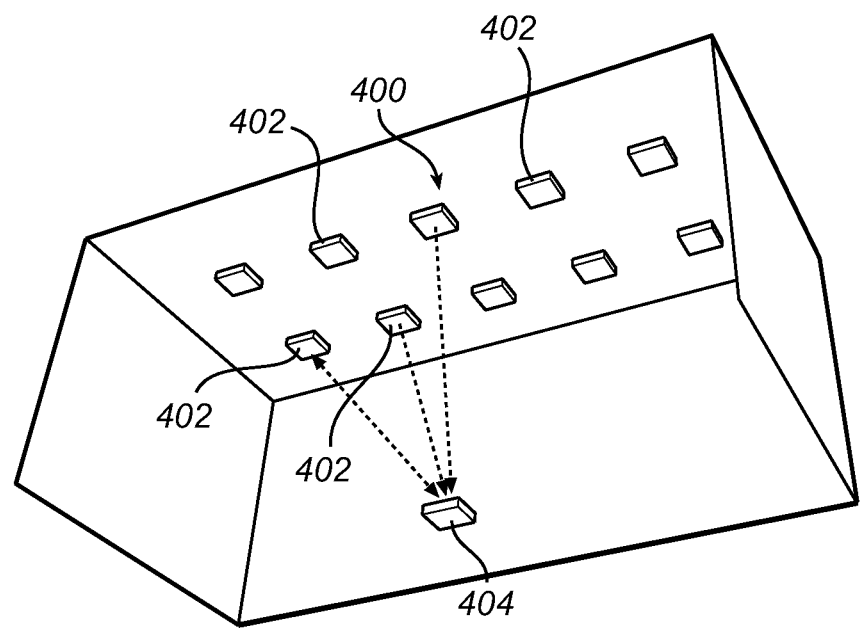
FIG. 4 schematically shows a lighting system employing the data generating system.

The data generating system 300 is useful in a lighting system 400, as schematically shown in FIG. 4, comprising several lighting devices 402, which communicate via coded light, i.e. light which is modulated to comprise embedded data invisible to the human eye, with a controller 404 and/or with each other, or the like, where the data generating system 300 is integrated in each lighting device 402, where the content handling device, which receives the output from the cell content access unit 310 of the memory device 302, typically is a modulator modulating the light output of the lighting device 402, as mentioned above in conjunction with the prior art of FIG. 1.

Figure 9:
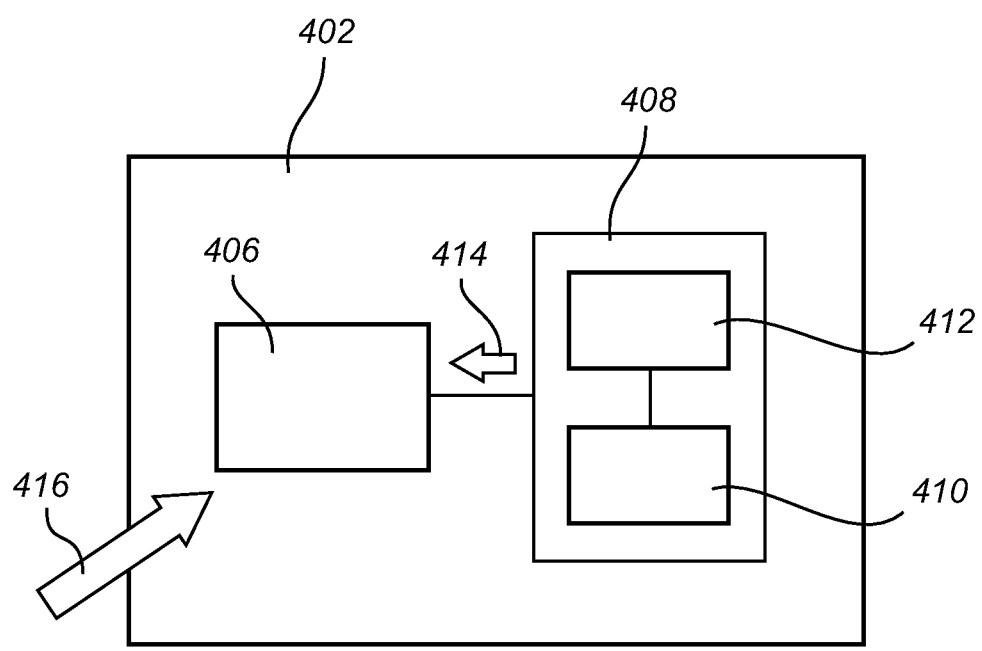
FIG. 9 is a block diagram of a lighting device including an embodiment of the data generating system.

According to an embodiment of the lighting device 402 (see FIG. 9) it comprise a data generating system 406, and a light source 408, which is connected with the data generating system 406. The light source 408 comprises a modulator and LED driver 410, and LEDs 412 driven by the modulator and LED driver 410. Primarily, the data generating system 406 is arranged to register one (or more) lighting device properties that changes during operation of the lighting device 402. In other words, the external physical effect 414 acting on the data generating system 406 is generated within the lighting device 402, and more particularly by the light source 408.

However, additionally, or alternatively, the external physical effect 416 is received from the surroundings of the lighting device 402.

The lighting device 402 is arranged to modulate its light output with the output data from the data generating system 406. That is, the data generating system 406 feeds the output data to the modulator and LED driver 410, which provides correspondingly modulated drive signals to the LEDs 412.

However, alternatively, or additionally, the lighting device 402 employs the output data for internal settings.

The data generating system 300 may also provide data to modulators for other communication means, e.g. Infra-red light, laser light, radio frequency communication, power line communication, load current modulation (wireless power), etc.

Additionally, the data generating system 300 can be used for lots of other applications and is not limited to light sources. As a basic requirement, some kind of physical excitation signal (temperature, radiation, static and dynamic electric and magnetic fields) should be available; however it is preferred that time can be monitored always.

As a benefit, basically no µC or complex logic is needed. Only a simple counter/clock generator as the data output trigger 304 is needed for the triggering of data output. In addition, no dedicated sensors and measurement signal processing units (signal conditioning, ADC, etc.) are required, because the memory device 302 itself includes the sensor function.

Figure 5:
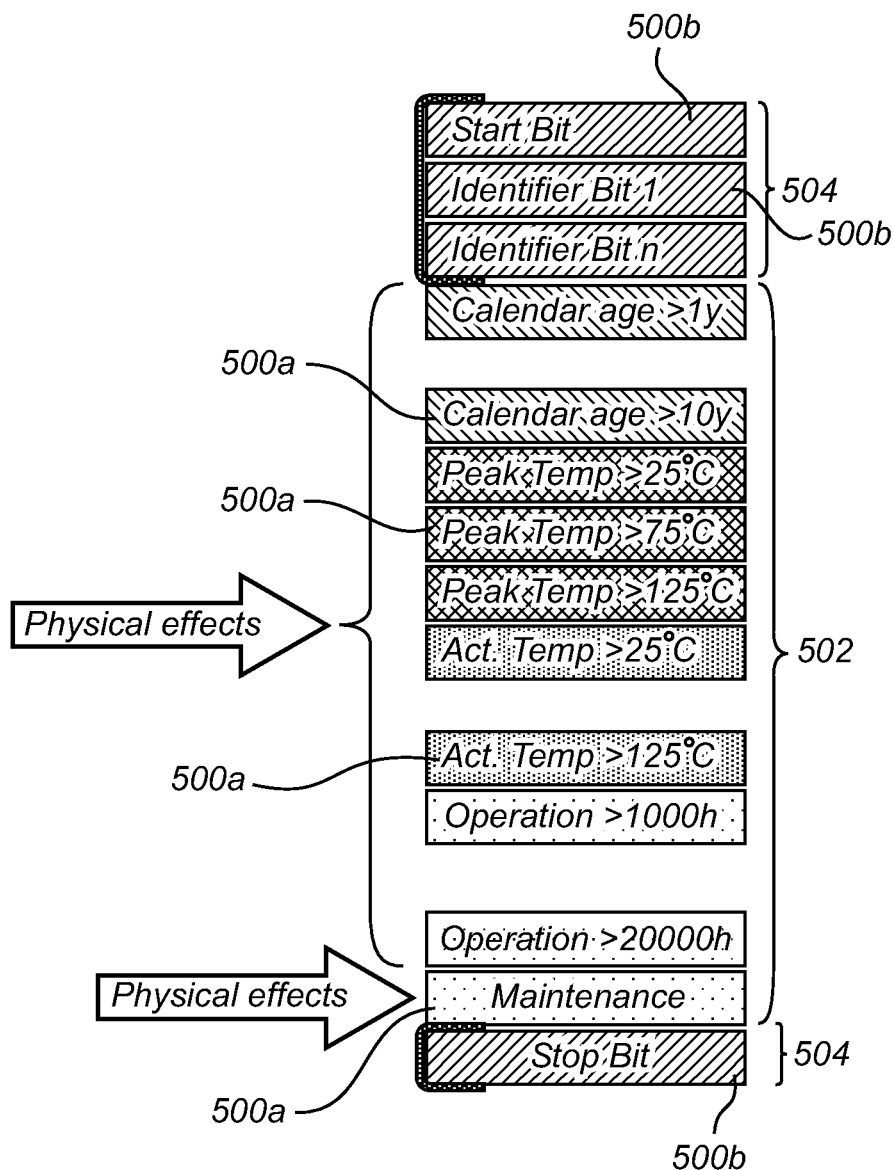
FIG. 5 schematically shows an example of a memory cell structure for a memory device which is comprised in the data generating system.

An example of the structure of memory cells 500a, 500b of the memory using different effects to capture different properties is shown in FIG. 5. Thus, a first set of memory cells 502 comprises dynamic memory cells 500a, which are sensitive to external physical effects, or where read-out logic included in the cell content access unit 310 and accessing the memory cells 500a, is sensitive, and a second set of memory cells 504 comprises static memory cells 500b, which are insensitive to external influence. For instance the dynamic memory cells 500a can include cells with a linear temperature stable leakage, suitable for tracking calendar age; cells with temperature sensitive leakage, suitable for detecting peak temperatures; cells accessed by temperature sensitive read-out logic of the cell content access unit 310, suitable for detecting the present temperature; and cells with light sensitivity, suitable for tracking operation hours, or indicating maintenance.

The static cells 500b are suitable for storing identification data, etc.

Consequently, not only the operating condition of the host device, such as a lighting device, e.g. a lamp, housing the data generating system 300 can be monitored, but also maintenance of the host device can be documented. In case a lamp should be cleaned, tested for electrical safety or fire hazard, etc., during its lifetime, one or a few memory cells indicating "Lamp has received maintenance" could be reserved. The content is only alterable by an external physical effect, given to a particular portion of the lamp by the service personal, e.g. via a voltage pulse or strong UV light.

This data, programmed by the service personal may be kept non-volatile in the lamps memory and embedded in the transmitted data stream of output data. Alternatively, the information may be "deleted" by some other mechanism during operation of the lamp, such that information like "Maintenance" is only valid for a certain time. E.g. the external physical effect may result in charging a cell, while the leakage will discharge the cell over time.

As described above, multiple external physical effects can be used to provide data storage with automatic alternation of data. Some of these alternations will influence the real data stored in the memory cells, while other methods will alter the way the stored data is interpreted.

For generating the data stream, a data output trigger 304 constituted by a counter driven by a clock, will subsequently trigger the cell content access unit 310 to address the cells, such that their content is fed into the data stream.

As mentioned above, there are many different ways to obtain the changeability of the output data. In the following, it will be described how to implement the above-mentioned alternatives a) to d).

a) "Weak" Programming of Bit Levels and Temperature Dependency of the Cell Content Access Unit According to this implementation example, the interpretation of the stored data is changed by an external physical effect influencing the cell content access unit 310. Further, the memory device 302 has a modern memory, such as a NAND-Flash memory, the memory cells of which can store multiple bits per cell, typically 2 bits per cell. This is achieved by storing 4 different voltage levels in the programming elements of the cell. The cell content access unit 310 is a kind of Analog-to-Digital-Converter (ADC), which is used to interpret the different voltage level ranges into one of four different digital results, which is then translated into two bits. For instance, SD-Cards are often based on these Multi Level Cells (MLC), because this kind of memory offers high data density at low cost, while offering still reasonable stability and endurance of the data.

Like any other real world system, the components involved in forming digital data from the analog stored value will have a temperature dependency. Memory cards for consumer application are often specified for a limited temperature range, e.g. 0-40° C., so that no erroneous interpretation of data will occur.

Figure 6:
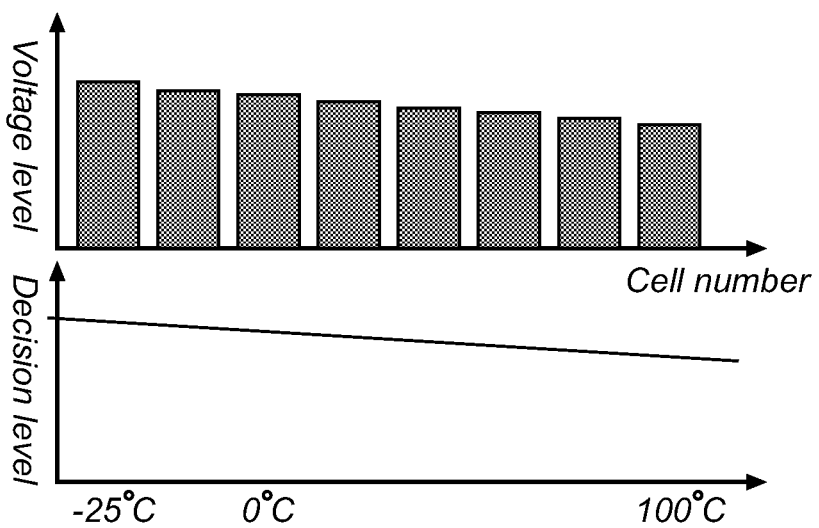
FIGS. 6 and 7 illustrate an example of changeable output data.
Figure 7:
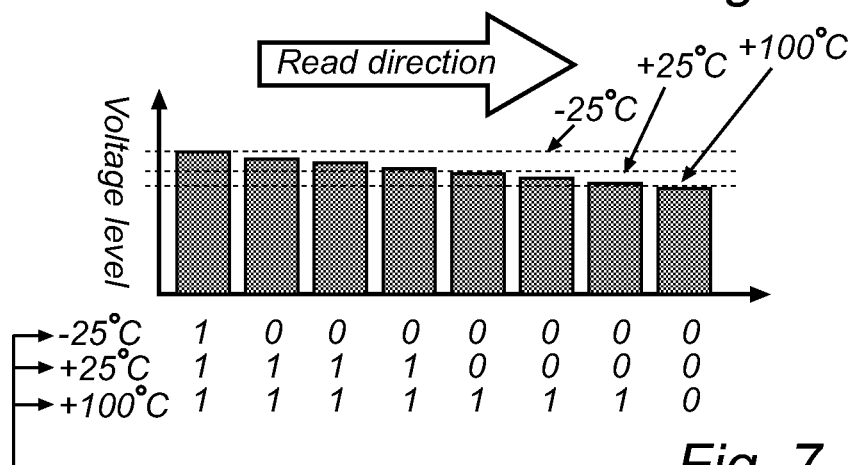

The temperature range of a light source might be much higher. For example, for retrofit lamps temperatures around 100° C. are quite common, because of limited cooling capabilities. Since ageing of the lamp-specific components, i.e. LEDs, capacitors, etc., is linked to the operation temperature, information on the temperature is important. To monitor the current temperature, some memory cells with programming values slightly above or below a nominal threshold and an ADC 310 with deterministic temperature dependency can be used. Assume the decision level of the ADC, above which cell content is read as "1" and below which cell content is read as "0", decreases with increasing temperature. A group of cells is programmed with voltages close to the decision level, such that more of them will read "1" with increasing temperature. The voltage levels in the cell decreases over cell position, such that cells with higher index number will need a higher temperature to read as "1" whereas cells with lower index number will read "1" already at intermediate temperatures, as shown in FIG. 6. Based on the actual temperature, the output data originating from that group of cells changes, as shown in FIG. 7. The programmed voltage per cell may be differently distributed, rather than in a straight sequence as shown here.

For the purposes of this application an alternative where the wiring between the cell content access unit 310 and some memory cells have a temperature dependency and are used separately or as a part of the temperature dependent solution, this wiring is considered to be included in the cell content access unit 310. The design according to this implementation example will code the actual temperature into the data stream, i.e. the output data, but will not alter the content of the cells.

b) Temperature Dependency of Leakage Current

According to this implementation example, the data in the sensitive memory cells 306 is programmed and stored via a charge on an isolated gate contact, also called floating gate comprised in each cell. Theoretically, any charge deposited there would stay there and influence the read-out signal of that cell forever. However, a real floating gate is not perfectly isolated, and after a very long time, the charge and hence the data stored there might be lost. For today's memory cards, data retention duration of minimum 10-20 year and typically >100 years are specified by the manufacturers. That means that the isolation is so good, that the charge deposited on the gate will not fall below/increase above the decision level threshold during that time.

The data retention duration can be used as an indicator of the age of a lamp. To use this as an indicator for the calendar age of a lamp, the data retention duration should be quite stable over temperature. Just like described above, the memory cells are programmed with voltages ranging from close to the threshold to far from the threshold. During ageing, regardless of powered or unpowered, charge will be lost and some cells' read-out value will pass the threshold over time.

However, typically, the operation hours are the more relevant information, compared to calendar age. During operation, temperature of the lamp will increase. The higher the temperature, the higher is the stress/ageing for the lamp. The same stress level is also true for the memory. So, when choosing memory cells with temperature dependency, the thermal stress will alter the stored data. When setting the programming levels like mentioned above, i.e. close to or far from the threshold, more and more cells alter their content, hence changing the data read-out, thereby indicating the operation time of the lamp.

Temperature dependency of leakage can be linear with temperature, or show strong nonlinear behavior. The latter is better suited for tracking the peak temperature.

c) Light Sensitivity of Memory Cells

Figure 8:
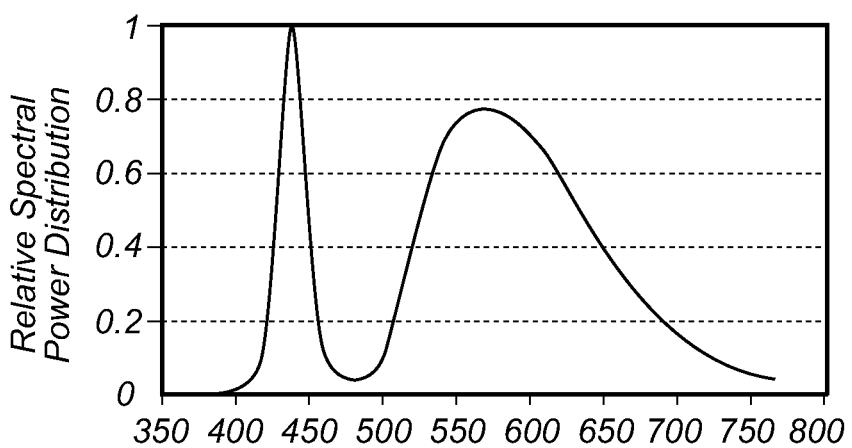
FIG. 8 is a graph of wavelength content.

EPROM (Erasable Programmable Read-Only Memory) technology is yet another potential candidate for the memory device 302. EPROMs are electrically programmable and optically erasable memories. Normally, they come in a housing with a transparent window, e.g. a quartz window, but this window is covered, such as with a sticker, to prevent light from reaching the chip, just below the window. To program the EPROM, charges are applied to floating gates. To erase the memory, the charges are removed by high energetic light, e.g. UV light, i.e. up to about 400 nm of wavelength. This process, when performed with a dedicated "eraser" with high intensity, takes about 20 minutes. Blue LEDs do not emit large amounts of UV light. However, some light emission in the 400 nm-range can also be found with phosphor converted white LEDs, as illustrated in FIG. 8. So, extended exposure to the (useable) light of such a LED lamp will also have an effect on the data in the memory cells 500*a*. Thus, when exposing the memory cells 500*a* to the blue light from the lamp, charge will also degrade, but very slowly. So, as an alternative to the temperature sensitive example in b), also light can be used to alter the data and hence measure the operation hours. Once again, different programming values can be used to have cells that will change their data passed a threshold after different periods of time. In addition, different illumination levels of different cells, e.g. by covering different cells with a material with different light absorption, can be used as an alternative or as an additional property.

d) Capacitive/Inductive Coupling Between Input/Load Currents and Memory Cells.

According to this implementation example, a physical property of memories storing data by using electrical effects is employed. Programming of floating gates is done via voltages in the range of 10V on extra electrodes, such that some charge carriers can tunnel through the isolation to the gate and remain there after removal of the programming voltage.

Similar influence on the memory cell can be realized by using other voltages that are present in the lamp. A higher voltage can be used, if placed in a wider distance from the floating gate. As an example, an important high voltage signal is a mains voltage surge. Then, peak voltages of 500-4000V occur at the input terminals of the LED lamp, heavily stressing the components. The lamps are rated to withstand a certain number of surge pulses with a certain peak voltage. In case a lamp fails (too early), one reason may be that there are too many and/or surge pulses of higher voltage present in the installation, e.g. because a lamp rated for residential use is installed in an industrial environment. The memory 302 can be designed to have some memory cells 306 that are sensitive to electrical field programming, where the content of the memory cells is altered when a threshold voltage is exceeded. Depending on the polarity of the voltage, cell content is altered to "1" or "0". For this embodiment, memory cells with pre-programmed "0" and "1" are required. As long as they stay with the pre-programmed value, not input voltage exceeding the limit has occurred. Again, memory cells with different sensitivity, such as by varying e.g. gate insulation distance can be used.

In case of memories with magnetic data storage, the magnet field of current can be used to alter the data. Alternatively, a pickup coil can receive a magnetic field and translate it into a programming voltage.

Above embodiments of the data generating system and lighting device according to the present invention as defined in the appended claims have been described. These should only be seen as merely non-limiting examples. As understood by the person skilled in the art, many modifications and alternative embodiments are possible within the scope of the invention as defined by the appended claims.

As an example of a modification, output data can also be used internally of the device in which the data generating system is mounted. For instance, in a lighting device, output data related to temperature can be used for thermal shutdown, and output data related to lifetime can be used for increasing a drive current for ageing compensation.

It is to be noted that for the purposes of his application, and in particular with regard to the appended claims, the word "comprising" does not exclude other elements or steps, and the word "a" or "an" does not exclude a plurality, which per se will be evident to a person skilled in the art.

The invention claimed is:

1. A lighting device comprising a light source, and a data generating system connected with the light source,
   wherein the data generating system comprises memory cells and a cell content access unit arranged to access content in the memory cells and provide corresponding output data,
   wherein the output data originating from at least one of the memory cells is changeable by means of an external physical effect acting directly on the memory device,
   wherein the external physical effect is generated within the lighting device,
   wherein the external physical effect constitutes at least one physical effect of a group of physical effects comprising temperature, visible light, non-visible light, electric fields and magnetic fields, and
   wherein the data generating system is arranged to register a lighting device property that changes during operation of the lighting device.

2. The lighting device according to claim 1, wherein the lighting device is arranged to modulate its light output with the output data from the data generating system.

3. The lighting device according to claim 1, wherein the lighting device is arranged to employ the output data for internal settings.

4. The lighting device according to claim 1, said data generating system comprising a data output trigger, which triggers data output from the memory device.

5. The lighting device according to claim 1, said output data being changeable by said at least one of the memory cells being receptive to the external physical effect for changing the contents of said at least one memory cell.

6. The lighting device according to claim 1, said output data being changeable by said content access unit being receptive to the external physical effect for changing its interpretation of the content of said at least one of the memory cells.

7. The lighting device according to claim 1, said at least one of the memory cells comprising at least one memory cell which is light sensitive.

8. A lighting device comprising a light source and a data generating system connected with the light source,
   wherein the data generating system comprises memory cells and a cell content access unit arranged to access content in the memory cells and provide corresponding output data,
   wherein the output data originating from at least one of the memory cells is changeable by means of an external physical effect acting directly on the memory device,
   wherein the external physical effect is generated within the lighting device,
   wherein the external physical effect constitutes at least one physical effect of a group of physical effects comprising temperature, visible light, non-visible light, electric fields and magnetic fields, said at least one of the memory cells comprising at least one memory cell being sensitive to an external physical effect generated within the lighting device and at least one memory cell being sensitive to an external physical effect received from the surroundings of the lighting device.

9. A lighting device comprising a light source and a data generating system connected with the light source,
   wherein the data generating system comprises memory cells and a cell content access unit arranged to access content in the memory cells and provide corresponding output data,
   wherein the output data originating from at least one of the memory cells is changeable by means of an external physical effect acting directly on the memory device,
   wherein the external physical effect is generated within the lighting device,
   wherein the external physical effect constitutes at least one physical effect of a group of physical effects comprising temperature, visible light, non-visible light, electric fields and magnetic fields, said at least one of the memory cells comprising at least one memory cell which is provided with a temperature sensitive leakage.

* * * * *